United States Patent
Yeh

(10) Patent No.: US 7,642,195 B2
(45) Date of Patent: Jan. 5, 2010

(54) HYDROGEN TREATMENT TO IMPROVE PHOTORESIST ADHESION AND REWORK CONSISTENCY

(75) Inventor: Wendy H. Yeh, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 404 days.

(21) Appl. No.: 11/235,298

(22) Filed: Sep. 26, 2005

(65) Prior Publication Data

US 2007/0072422 A1 Mar. 29, 2007

(51) Int. Cl.
*H01L 21/302* (2006.01)
(52) U.S. Cl. .................. 438/725; 438/709; 438/771; 438/723
(58) Field of Classification Search .......... 438/706, 438/710, 712, 714, 720, 723, 733, 736, 717, 438/725
See application file for complete search history.

(56) References Cited

U.S. PATENT DOCUMENTS

| | | | |
|---|---|---|---|
| 6,364,954 B2 | 4/2002 | Umotoy et al. | |
| 6,451,504 B2 | 9/2002 | Rolfson et al. | |
| 6,593,246 B1* | 7/2003 | Hasegawa et al. | 438/736 |
| 6,630,406 B2 | 10/2003 | Waldfried et al. | |
| 6,853,043 B2 | 2/2005 | Yeh et al. | |
| 7,282,452 B2* | 10/2007 | Kanegae et al. | 438/706 |
| 2002/0111017 A1 | 8/2002 | Kirkpatrick et al. | |
| 2003/0008528 A1 | 1/2003 | Xia et al. | |
| 2003/1003230 * | 2/2003 | Waldfried et al. | 438/725 |
| 2004/0018748 A1* | 1/2004 | Lu et al. | 438/778 |
| 2004/0235299 A1 | 11/2004 | Srivastava et al. | |
| 2005/0070128 A1 | 3/2005 | Xia et al. | |

OTHER PUBLICATIONS

Chang et al., "Effects of hydrogen on electrical and chemical properties of Low-K hydrogen silsesquioxane as an intermetal dielectric for nonetchback processes", Electrochemical and Solid State Letters, IEEE Service Center, Piscataway, NJ, US, XP000907145, vol. 2, No. 8, 1999, pp. 390-392.
PCT International Search Report and Written Opinion mailed Feb. 19, 2007, International Application No. PCT/US2006/037751, 13 pages.

* cited by examiner

*Primary Examiner*—Lan Vinh
(74) *Attorney, Agent, or Firm*—Townsend and Townsend and Crew LLP

(57) ABSTRACT

A process for selectively removing photoresist, organic overlayers, and/or polymers/residues from a substrate without altering the surface chemistry and adhesion properties of the underlying substrate layers is provided. Generally, the process includes pretreating the substrate with hydrogen (e.g., by way of a hydrogen-based plasma) prior to deposition of a photoresist layer, and then ashing the substrate with a hydrogen-based plasma to selectively remove the photoresist, organic overlayers, and/or polymers/residues from the substrate during etching, post-etch, rework, etc. The hydrogen-based ashing process of the invention may be used post-etch to remove the residue photoresist, or may be used in a rework stripping process to remove misaligned patterns. The hydrogen-based ashing process following the initial hydrogen surface pretreatment substantially reduces surface chemistry poisoning, while retaining adequate adhesion properties following ashing.

20 Claims, 3 Drawing Sheets

HYDROGEN TREATMENT TO IMPROVE PHOTORESIST ADHESION AND REWORK CONSISTENCY

BACKGROUND OF THE INVENTION

Ashing is a plasma mediated stripping process by which photoresist, organic overlayers, and/or polymer residues are stripped or removed from a substrate upon exposure to a plasma. Ashing generally occurs after an etching process has been performed in which the photoresist material is used as a photomask for etching a pattern into the substrate. The ashing process is also used to remove other organic layers such as the anti-reflection coating (ARC), if present. Additionally, the ashing process may be performed for removal of misaligned resist patterns ("rework wafers") and in lift-off processes. It is well known that the process steps occurring prior to ashing may modify the surface of the photoresist and ARC, and/or form polymers/residues. It is highly desirable when ashing that complete removal of the photoresist and other organic overlayers, polymers/residues occur as quickly as possible without loss of any of the materials comprising the underlayers.

It is important to note that ashing processes significantly differ from etching processes. Although both processes may be plasma mediated, an etching process is markedly different in that the plasma chemistry is chosen to permanently transfer an image into the substrate by removing portions of the substrate surface through openings in a photoresist mask. The plasma generally includes high energy ion bombardment at low temperatures to remove portions of the substrate. Moreover, the portions of the substrate exposed to the ions are generally removed at a rate equal to or greater than the removal rate of the photoresist mask. In contrast, ashing processes generally refer to selectively removing the photoresist mask and any polymers or residues formed during etching. The ashing plasma chemistry is much less aggressive than etching chemistries and generally is chosen to remove the photoresist mask layer at a rate much greater than the removal rate of the underlying substrate. Moreover, most ashing processes heat the substrate to temperatures greater than 200° C. to increase the plasma reactivity. Thus, etching and ashing processes are directed to removal of significantly different materials and as such, require completely different plasma chemistries and processes. Successful ashing processes are not used to permanently transfer an image into the substrate. Rather, successful ashing processes are defined by the photoresist, polymer and residue removal rates without affecting or removing layers comprising the underlying substrate.

During plasma ashing processes, it is important to maintain a critical dimension (CD) for the various features within a tightly controlled specification as well as promote proper underlayer surface conditions for successful metal filling in the process steps occurring after photoresist and/or polymer/residue removal. Small deviations in the patterned profiles formed in the underlayers can adversely impact device performance, yield and reliability of the final integrated circuit. Traditionally, the ashing plasma has been generated from oxygen-containing gases. However, it has been found that oxygen-containing plasmas readily damage certain materials used in advanced integrated circuit manufacture. For example, oxygen-containing plasmas are known to raise the dielectric constant of low k dielectric underlayers during plasma processing. The increases in dielectric constant affects, among others, interconnect capacitance, which directly impacts device performance. Moreover, the use of oxygen-containing plasmas is generally less preferred for advanced device fabrication employing copper metal layers.

In order to overcome these problems, oxygen-free plasma chemistries have been developed. Limited oxygen-free plasmas have been used to remove photoresist, organic overlayers, and polymers/residues from substrates containing low k dielectric materials without physically damaging the low k dielectric layer. Oxygen-free plasmas are typically generated from a hydrogen/nitrogen gas mixture that may further contain fluorine gases. However, in some cases, it has been found that the use of such oxygen-free plasmas alter and/or affect the chemical, mechanical and electrical properties of the underlying substrate. For example, exposing carbon and/or hydrogen containing low k dielectric materials to oxygen-free plasma generated from hydrogen, nitrogen and fluorine gas mixtures results in significant damage. Occasionally, the damage is not detected during metrology inspection of the substrate after plasma processing. However, the damage can be readily demonstrated by a subsequent wet cleaning process, as may be typically employed after plasma ashing, wherein portions of the carbon and/or hydrogen-containing low k dielectric material are removed. The removed portions of the dielectric material are a source of variation in the critical dimension (CD) of the feature that is frequently unacceptable and impacts overall device yield. Moreover, even if a wet clean process is not included, the electrical and mechanical properties of the dielectric material may be changed by exposure to the oxygen-free plasmas thereby affecting operating performance. It is believed that carbon is depleted from the dielectric material during the plasma exposure. Since oxygen-free plasmas are normally generated from gas mixtures that contain nitrogen, it is believed that nitrogen damages the dielectric in such a way that it causes problems during subsequent metal filling processes, such as the creation of voids at the bottom of trench structures.

As such, improved oxygen-free plasma ashing processes are needed.

BRIEF SUMMARY OF THE INVENTION

To address these and other needs, the present invention provides, in part, oxygen-free plasma ashing processes wherein the surface properties of underlying substrate layers are substantially unchanged by the ashing process.

In a first aspect, a plasma ashing process for selectively removing photoresist, organic overlayers and/or polymers/residues from a semiconductor substrate without substantially degrading adhesion properties of underlying substrate layers is provided. The process generally comprises: positioning a substrate in a plasma reactor; providing a hydrogen source gas to the plasma reactor and reacting the hydrogen source gas in the presence of an energy source to generate a hydrogen-based plasma; and exposing the substrate to the hydrogen-based plasma under plasma ashing conditions sufficient to selectively remove the photoresist and/or the organic overlayers. In accordance with the invention, the adhesion properties of the underlying substrate layers are not substantially degraded by the plasma ashing process.

More particularly, the substrate comprises a photoresist layer and/or organic layer deposited over a dielectric layer or oxide layer, wherein said dielectric layer or oxide layer has been treated with hydrogen prior to deposition of the photoresist layer, organic overlayers and/or polymers/residues. In one embodiment, the combination of the hydrogen pretreatment of the dielectric or oxide layer of the substrate with the hydrogen-based plasma ashing process of the invention, selectively removes the photoresist, organic overlayers and/ or polymers/residues to thereby leave said underlying dielectric layer or oxide layer in a reduced state in a reduced state such that the adhesion properties of said underlying dielectric layer or oxide layer are not substantially degraded by said plasma ashing process.

In certain embodiments, the hydrogen source gas preferably includes hydrogen-bearing gas and a noble gas, such as hydrogen gas and helium. In other embodiments, the hydrogen-based plasma is substantially free from reactive nitrogen species and reactive oxygen species.

In other embodiments, the reflectivity index of the underlying dielectric layer or oxide layer is substantially unchanged by the plasma ashing processing. In yet other embodiments, the wetting angle of the underlying dielectric layer or oxide layer is substantially unchanged by the plasma ashing processing.

In another aspect of the invention, a plasma ashing process for selectively removing photoresist, organic overlayers and/or polymers/residues from a semiconductor substrate without substantially degrading adhesion properties of underlying substrate layers is provided. The process comprises: providing a substrate comprising a dielectric or oxide surface layer and pretreating the dielectric or oxide surface layer with a first hydrogen based plasma to generate substrate comprising a hydrogen-treated dielectric oxide layer. At least one photoresist layer, organic overlayers and/or polymers/residues is then deposited over the hydrogen-treated dielectric or oxide layer and patterned via an etching process to generate a substrate comprising an etched photoresist pattern over the hydrogen-treated dielectric or oxide layer. The etched photoresist pattern is then exposed to a second hydrogen-based plasma under plasma ashing conditions sufficient to selectively remove the photoresist, organic overlayers and/or polymers/residues to thereby leave said underlying hydrogen-treated dielectric or oxide layers in a reduced state such that the adhesion properties of the underlying hydrogen-treated dielectric or oxide layer are not substantially degraded by the plasma ashing process.

These and other embodiments of the present invention along with many of its advantages and features are described in more detail in conjunction with the text below and attached figures.

DETAILED DESCRIPTION OF THE INVENTION

In accordance with the present invention, it has been unexpectedly found that the surface chemistry and adhesion properties of hydrogen treated dielectric and/or oxide substrate layers can be maintained following photoresist ashing and/or rework in an oxygen free environment. More particularly, it has been found that hydrogen treated dielectric and oxide substrate surfaces retain good adhesion, reflectivity index, and wetting angle following hydrogen-based stripping of the photoresist layer, e.g., ashing and/or rework. Further, it has been found that good critical dimension (CD) of the etched substrate may be maintained, as well as the dielectric constant of the dielectric layer.

In one aspect, process for selectively removing photoresist, organic overlayers, and/or polymers/residues from a substrate without altering the surface chemistry and adhesion properties of the underlying substrate layers is provided. Generally, the process includes pretreating the substrate with hydrogen (e.g., by way of a hydrogen-based plasma) prior to deposition of a photoresist layer, and then ashing the substrate with a hydrogen-based plasma to selectively remove the photoresist, organic overlayers, and/or polymers/residues from the substrate during etching, post-etch, rework, etc. The hydrogen-based ashing process of the invention may be used post-etch to remove the residue photoresist, or may be used in a rework stripping process to remove misaligned patterns. The hydrogen-based ashing process following the initial hydrogen surface pretreatment substantially reduces surface chemistry poisoning, while retaining adequate adhesion properties following ashing.

Ashing selectivity may be defined as the relative removal rate of the photoresist and other organic overlayers, compared to the underlying layers. It is generally preferred to have an ashing selectivity of at least 50:1, wherein the photoresist is removed at least 50 times faster than the underlying substrate layers. More preferably, the ashing selectivity is much greater than 100:1.

I. Exemplary Film Stack

Figure 1:
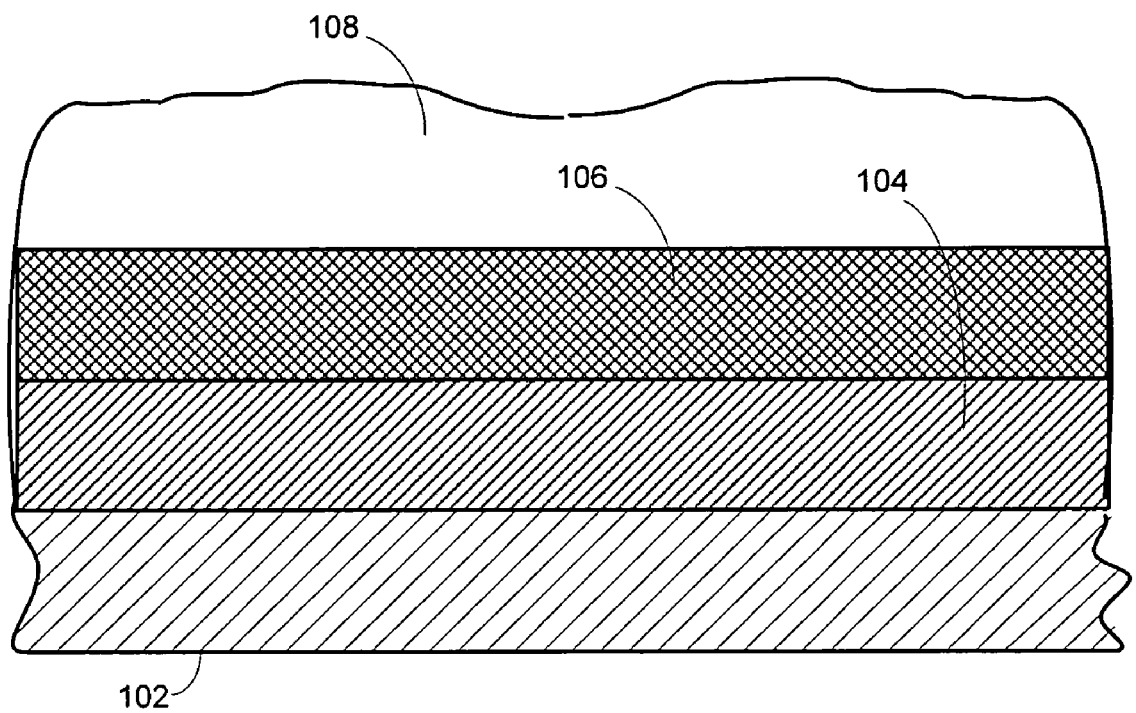
FIG. 1 illustrates an exemplary film stack useful in connection with the methods of the invention.

FIG. 1 is a cross-sectional view of the film 100, which includes substrate 102. The substrate 102 may be, for example, a silicon substrate, a germanium substrate, a silicon-germanium substrate, and the like. Film 100 may further include a series of material layers deposited on the substrate 102. Specifically, a lower barrier layer 104 may optionally be deposited over the substrate 102 (generally, comprising a dielectric such as SiOC, or a hard mask comprised of, e.g., silicon dioxide ($SiO_2$), hafnium dioxide ($HfO_2$), Advanced Patterning Film™ (APF) (available from Applied Materials, Inc. of Santa Clara, Calif.), or the like). A dielectric or oxide layer 106 may then be subsequently deposited over the lower barrier layer 104 (or directly on substrate 102). Photoresist layer 108 may then be deposited over dielectric or oxide layer 106. In accordance with certain embodiments of the invention, as described in further detail below, dielectric or oxide layer 106 is preferably pre-treated with hydrogen prior to deposition of photoresist layer 108. One of skill will recognize that the substrate may also include a plurality of additional layers over the substrate. For instance, in certain embodiments, the substrate may include additional dielectric layers including insulative materials, etch stops layers, trench layers, etc. as is known in the art.

The layers of the film stack 100 can be formed using any conventional thin film deposition technique, such as atomic layer deposition (ALD), physical vapor deposition (PVD), chemical vapor deposition (CVD), plasma enhanced CVD (PECVD), high-density plasma CVD (HDP-CVD) and the like. Fabrication of the film may be performed using, e.g., the respective processing reactors of CENTURA™, ENDURA™, ULTIMA™ and other semiconductor wafer processing systems available from Applied Materials, Inc. of Santa Clara, Calif.

The optional lower barrier layer 104 may be deposited to a thickness in a range of about 500 Å to about 1500 Å, and may be formed using a process such as a PECVD. The lower barrier layer 104 may be deposited in one embodiment of the invention by supplying a precursor compound, such as: a combination of silicon containing precursors (silane, TEOS, or silane and carbon containing precursors such as TMS, etc.), $N_2O$, $CO_2$, and/or a carrier gas such as He, Ar, $N_2$; a combination of carbon containing precursors and carrier gases ($C_3H_6$, etc.); or a combination of silicon and carbon containing precursors, to a plasma processing chamber at a flow rate, e.g., between about 500 sccm and about 10,000 sccm, optionally supplying a dopant at a flow rate between about 10 sccm and about 10,000 sccm, providing an inert gas at a flow rate between about 1 sccm and about 100,000 sccm, maintaining a substrate temperature between about 100° C. and about 550° C., maintaining a chamber pressure below about 500 Torr, and an RF power of between about 0.03 watts/cm² and about 1500 watts/cm².

A dielectric or oxide layer 106 may be deposited over the lower barrier layer 104 (or over substrate 102). In one embodiment, the dielectric or oxide layer 106 comprises a low K dielectric material such as, for example, an organosilicate material, a porous oxide material, a silsesquioxane material, paralyne, a spin-on glass material such as un-doped silicon glass (USG), a fluorine-doped silicon glass (FSG) or combinations thereof. One example of an organosilicate-based low K dielectric layer is commercially available from Applied Materials, Inc., of Santa Clara, Calif. and sold under the trade name BLACK DIAMOND™.

Alternatively, the dielectric or oxide layer 106 may comprise an anti-reflective coating (ARC) that controls the reflection of light used to expose the photoresist during a subsequent lithographic patterning process (discussed infra). As feature sizes are reduced, inaccuracies in an etch mask pattern transfer process can arise from optical limitations that are inherent to the lithographic process, such as light reflection. As such, an anti-reflective coating (ARC) may be used. The ARC may comprise an organic anti-reflective coating (OARC) (e.g., polyamide, and the like) or a dielectric anti-reflective coating (DARC) (e.g., silicon nitride (SiN), and the like). Preferred DARC materials include nitrogen-free ARC, such as those described in U.S. Pat. No. 6,853,043, which is herein incorporated by reference in its entirety. One example of a DARC material is DARC 193™, commercially available from Applied Materials, Inc. of Santa Clara, Calif.

The dielectric or oxide layer 106 may have a thickness of about 200 Å to about 1000 Å. The dielectric layer 106 may be formed using a process such as a PECVD. In general, the following deposition process parameters may be used to form an dielectric layer 106 using a CVD process chamber, such as the DxZ™ chamber manufactured by Applied Material, Inc. of Santa Clara, Calif. The process parameters range from a chamber temperature of about 300° C. to about 550° C.; a chamber pressure of about 2 Torr to about 10 Torr; an RF power of between about 25 watts/cm² and about 1000 watts/cm²; and a $SiH_4$ gas flow rate of about 5-200 sccm, an oxygen source gas flow rate of about 1000-10,000 sccm, an inert gas flow rate of about 0 to 10,000 sccm, among others, may be used to form the plasma. Detailed methods suitable for depositing the dielectric or oxide layer 106 are described in U.S. Pat. No. 6,853,043. Further, as mentioned above, dielectric or oxide layer 106 is preferably pre-treated with hydrogen, e.g., a hydrogen plasma, prior to deposition of photoresist layer 108, as described in further detail below.

Photoresist layer 108 may then be deposited over dielectric or oxide layer 106 and patterned using appropriate radiation, as is known to those skilled in the art. Photoresists are generally organic photosensitive films used for transfer of images to an underlying substrate. The present disclosure is generally applicable to those photoresists used in, e.g., g-line, i-line, DUV, 193 nm, 130 nm, 90 nm applications or the like. This includes, but is not limited to, novolaks, polyvinylphenols, acrylates, acetals, polyimides, ketals, cyclic olefins or the like. Other photoresist formulations suitable for use in the present disclosure will be apparent to those skilled in the art in view of this disclosure. The photoresist may be positive acting or negative acting depending on the photoresist chemistries and developers chosen. Examples of organic overlayers include, but are not intended to be limited to, ARC, bottom antireflection coatings (BARC), and other proprietary sacrificial materials that are typically part of mask ensembles.

Although described above using a single layer of dielectric or oxide material 106, it is understood that other embodiments of the invention may employ tow or more separate layers stacked on top of each other, as known in the art. Further, film 100 may comprise hard mask layers, as known in the art (not shown). Such mask layers may include photoresist layer 108, and may be comprised of silicon dioxide ($SiO_2$), hafnium dioxide ($HfO_2$), Advanced Patterning Film™ (APF) (available from Applied Materials, Inc. of Santa Clara, Calif.), or the like.

II. Exemplary Method for Improving Photoresist Adhesion and Rework Consistency

Figure 2:
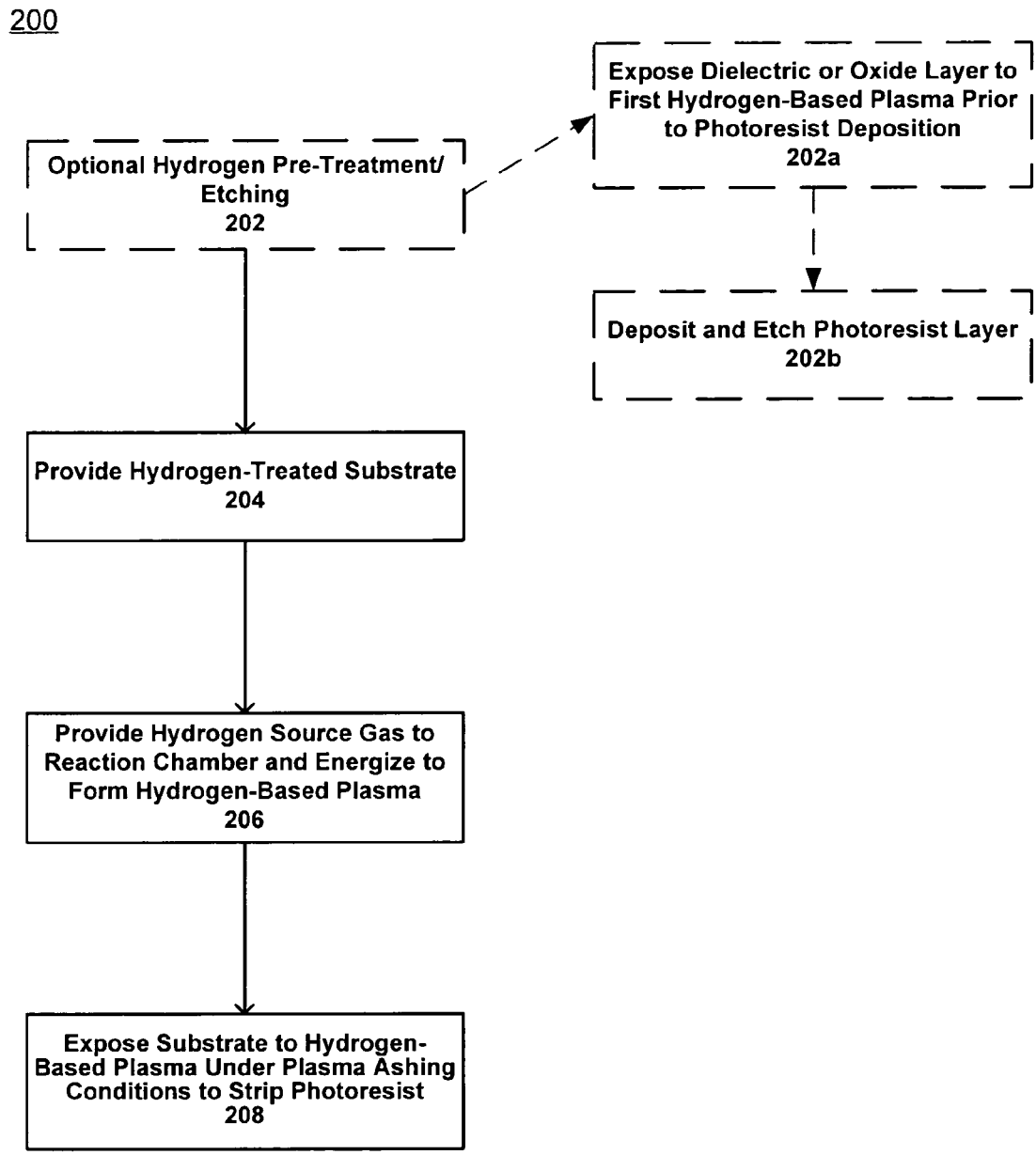
FIG. 2 is a flow diagram illustrating an exemplary method of the invention.

FIG. 2 is a flow diagram of a method 200 of the present invention. In accordance with method 200, at block 204, a post-etch substrate is located in a process chamber capable of performing photoresist stripping. The substrate may already be located in the chamber, e.g., following previous etching or deposition processing, or it may be newly transferred to the chamber as needed. Any suitable process chamber capable of performing photoresist stripping may be used in connection with the present invention, such as described below with reference to FIG. 3. Alternatively, the AXIOM™ reactor, manufactured by Applied Materials, Inc. of Santa Clara, Calif., the APPLIED CENTURA ENABLER™, also manufactured by Applied Materials, Inc., or a suitable photoresist ashing chamber manufactured by Mattson may be used.

At block 206, method 200 continues, where a hydrogen source gas is provided to the process chamber and energized to form a hydrogen-based plasma. By way of example, a hydrogen source gas flow rate of about 100 to 10,000 sccm may be used, and RF power of about 20 to 3000 watts may be applied to the source gas. The pressure in the chamber may be maintained at about 0.3 to 20 Torr, and the temperature of the substrate may be maintained at about 15 to 550 degrees Celsius. In one embodiment of the invention, an RF bias of 100 to 2000 watts may also be applied to the substrate if desired. At block 208, the photoresist layer 108 is then stripped by the hydrogen-based plasma under ashing conditions sufficient to selectively remove the photoresist 108 and/or the organic overlayers to thereby leave said underlying dielectric or oxide layer 106 in a reduced state such that the adhesion properties of the underlying dielectric or oxide layer 106 are not substantially degraded by the ashing process.

In accordance with the present invention, to improve adhesion of the photoresist layer 108 to the underlying dielectric or oxide layer 106, and to reduce poisoning of the dielectric or oxide layer 106 during stripping (or an underlying sub-layer, e.g., oxide, mask, etc.), the dielectric or oxide layer 106 of the substrate may be pretreated at optional block 202 (prior to photoresist deposition and etching at step 202b) with atomic free hydrogen. Without intending to be limited by theory, it is believed that oxide present at the surface of layer 106 is reduced via the free atomic hydrogen, thereby improving surface properties.

In one embodiment, the dielectric oxide layer 106 is exposed to a hydrogen-based plasma at optional step 202a. The hydrogen plasma may be formed, for example, in a PRODUCER™ chamber at 400° C. with a pressure of about 4 Torr, an RF power of about 200 Watts and an hydrogen source gas flow rate of about 400 sccm. For a lower barrier layer 104 of thickness 500 Å to 1500 Å, the treatment may be applied for 5-45 seconds and, in one embodiment, for 15 seconds. The hydrogen plasma treatment can also be performed in a DxZ chamber available from Applied Materials, Inc. using 300° C., 10 Torr, and an RF power of below 1000 Watts.

Hydrogen source gases suitable for use in the ashing process of block 208 and the hydrogen pretreatment of optional block 202 include those compounds that contain hydrogen. Exemplary hydrogen source gases include hydrocarbons, hydrofluorocarbons, hydrogen gas, ammonia, or mixtures thereof. Preferred hydrogen source gases exist in a gaseous state at plasma forming conditions and release hydrogen to form reactive hydrogen such as atomic hydrogen species under plasma forming conditions. The hydrocarbons or hydrofluorcarbons are generally unsubstituted or may be partially substituted with a halogen such as bromine, chlorine or fluorine. Examples of hydrogen source gas hydrocarbon gases include methane, ethane and propane.

Preferred hydrogen source gases are mixtures of a hydrogen gas and a noble gas. Examples of noble gases suitable for use in the process include a gas in Group VIII of the periodic table such as argon, neon, helium and the like. Although prior art oxygen-free plasmas generally use a forming gas composition that includes a hydrogen and nitrogen gas mixture, the use of substantial amounts of nitrogen gas in the process is preferably excluded in one embodiment. Consequently, since forming gas is hereinafter defined as a gas containing a mixture of hydrogen and nitrogen gases (nitrogen is generally greater than about 70% by volume or more in the forming gas mixture), the use of forming gas in the process is expressly excluded in one embodiment. In one embodiment, the hydrogen source gas is substantially free from nitrogen species and oxygen species, and the resulting hydrogen-based plasma is substantially free from reactive nitrogen species and reactive oxygen species.

Particularly preferable for use in the present disclosure is a gas mixture that includes hydrogen and helium gases. Helium gas generates helium atoms in the plasma that are considered light atoms and readily diffuse to the substrate, which results in excellent carrier characteristics for plasma generated reactive hydrogen species.

In certain embodiments, the percentage of hydrogen gas in the gas mixture will not exceed about 5 percent by volume of the gas mixture. However, higher amounts of hydrogen are acceptable and sometimes preferred for increasing the photoresist and organic overlayer removal rate and selectivity. Preferably, the amount of hydrogen in the gas mixture is from about 1 to about 99 percent of the total volume. More preferably, the amount of hydrogen in the gas mixture is from about 3 to about 30 percent of the total volume.

As described above, it has been unexpectedly found that the surface chemistry and adhesion properties of hydrogen treated dielectric and/or oxide substrate layers can be maintained following photoresist ashing and/or rework in accordance with the present invention. More particularly, it has been found that hydrogen treated dielectric and oxide substrate surfaces retain good adhesion, reflectivity index, and wetting angle following hydrogen-based stripping of the photoresist layer, i.e., that such properties are not substantially changed or affected by the ashing process. Further, it has been found that good critical dimension (CD) of the etched substrate may be maintained, as well as the dielectric constant of the dielectric layer.

By way of example, a wetting angle in the range of 50 to 65 degrees (e.g., 63.3 degrees) may be obtained for hydrogen-treated dielectrics such as DARC 193™, good adhesion following hydrogen-based photoresist stripping, with and without rework. As such, in one embodiment, the hydrogen-based ashing process of the invention does not substantially degrade the adhesion properties of underlying substrate layer, such as the underlying hydrogen treated dielectric or oxide layer.

In another embodiment, the hydrogen-based ashing process of the invention does not substantially change the reflectivity index or depth of focus of the underlying substrate layer, e.g., the hydrogen treated dielectric layer or oxide layer. In yet another embodiment, the hydrogen-based ashing process of the invention does not substantially change the wetting angle of the underlying substrate layer, e.g., the hydrogen treated dielectric layer or oxide layer. For example, the hydrogen-based ashing process does not change the wetting angle of the hydrogen treated substrate layer by more than 30 degrees.

In accordance with certain aspects of the invention, it was unexpectedly found that the combination of hydrogen-based ashing with hydrogen pre-treatment of the underlying dielectric or oxide layer resulted in an improved ability to maintain the adhesion and surface chemistry characteristics of the dielectic or oxide layer following stripping of the photoresist layer, e.g., during ashing and/or rework. As such, further processing of the stripped substrate may be improved, including but not limited to, gap-fill characteristics, photoresist adhesion, mask alignment, rework consistency, etc.

III. Exemplary Ashing Chamber

The methodology of the present invention can be practiced in conventional plasma reactors known in the art suitable for ashing processes. In particular, the plasma ashing methods described herein are not intended to be limited to any particular plasma asher. For example, a plasma asher employing an inductively coupled plasma reactor could be used, or a downstream plasma asher could be used. In one embodiment, the plasma asher is a downstream plasma asher, such as for example, the AXIOM™ reactor manufactured by Applied Materials of Santa Clara, Calif., or an offline asher chamber manufactured by Mattson, as known in the art.

Figure 3:
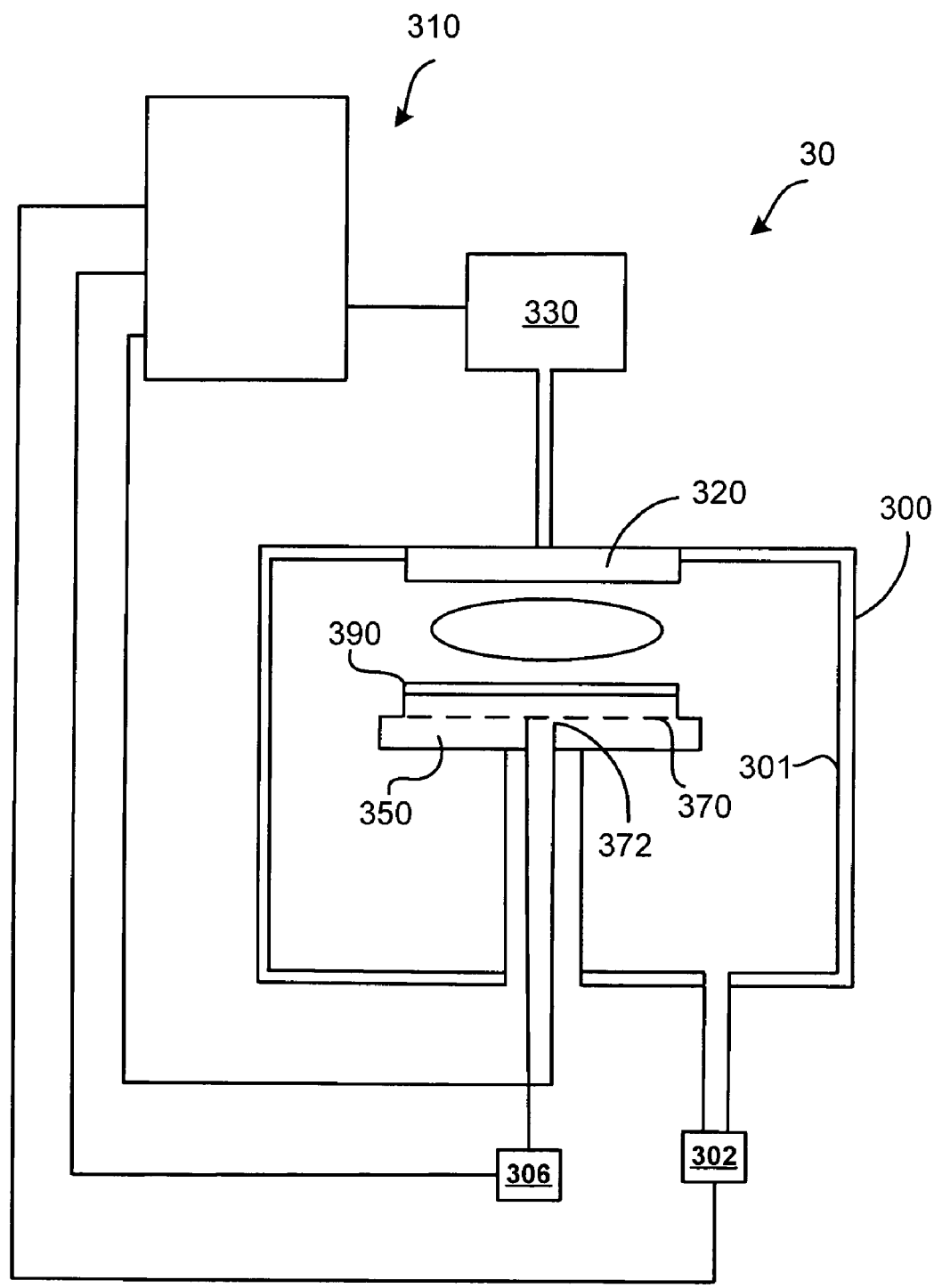
FIG. 3 is a simplified diagram of one embodiment of a reactor with which methods of the invention may be implemented.

By way of example, FIG. 3 depicts a schematic diagram of a system 30 that may be used to practice portions of the method 200. This system 30 typically comprises a process chamber 300, a gas panel 330, a control unit 310, along with other hardware components such as power supplies and vacuum pumps. Details of the system 30 used in connection with the present invention are described in U.S. Pat. No. 6,364,954, which is herein incorporated by reference.

The salient features of this system 30 are briefly described below. Examples of system 30 include CENTURAO systems, PRECISION 5000™ systems and PRODUCER™ systems commercially available from Applied Materials Inc., Santa Clara, Calif.

The process chamber 300 generally comprises a support pedestal 350, which is used to support a substrate such as a semiconductor wafer 390. This pedestal 350 can typically be moved in a vertical direction inside the chamber 300 using a displacement mechanism (not shown). Depending on the specific process, the wafer 390 can be heated to some desired temperature prior to processing. In the present invention, the wafer support pedestal 350 is heated by an embedded heater element 370. For example, the pedestal 350 may be resistively heated by applying an electric current from an AC supply 306 to the heater element 370. The wafer 390 is, in turn, heated by the pedestal 350. A temperature sensor 372, such as a thermocouple, is also embedded in the wafer support pedestal 350 to monitor the temperature of the pedestal 350 in a conventional manner. The measured temperature is used in a feedback loop to control the power supply 36 for the heating element 370 such that the wafer temperature can be maintained or controlled at a desired temperature which is suitable for the particular process application. The pedestal 350 is optionally heated using a plasma or by radiant heat (not shown).

A vacuum pump 302, is used to evacuate the process chamber 300 and to maintain the proper gas flows and pressure inside the chamber 300. A showerhead 320, through which process gases are introduced into the chamber 300, is located above the wafer support pedestal 350. The showerhead 320 is connected to a gas panel 330, which controls and supplies various gases used in different steps of the process sequence.

The showerhead 320 and wafer support pedestal 350 also form a pair of spaced apart electrodes. When an electric field is generated between these electrodes, the process gases introduced into the chamber 300 are ignited into a plasma. Typically, the electric field is generated by connecting the wafer support pedestal 350 to a source of radio frequency (RF) power (not shown) through a matching network (not shown). Alternatively, the RF power source and matching network may be coupled to the showerhead 320, or coupled to both the showerhead 320 and the wafer support pedestal 350.

Having fully described several embodiments of the present invention, many other equivalent or alternative methods of depositing the low dielectric constant oxide layer according to the present invention will be apparent to those skilled in the art. These alternatives and equivalents are intended to be included within the scope of the present invention.

What is claimed is:

1. A plasma ashing process for selectively removing photoresist, organic overlayers and/or polymers/residues from a semiconductor substrate, the process comprising:
    positioning a substrate in a plasma reactor, said substrate comprising a photoresist layer and/or organic layer deposited over a dielectric layer or oxide layer, wherein said dielectric layer or oxide layer has been treated with hydrogen-based plasma prior to deposition of said photoresist layer and/or organic overlayer and after deposition of said dielectric layer or oxide layer;
    providing a hydrogen source gas to said plasma reactor and reacting the hydrogen source gas in the presence of an energy source to generate a hydrogen-based plasma; and
    exposing said substrate to said hydrogen-based plasma under plasma ashing conditions sufficient to selectively remove the photoresist, organic overlayers and/or polymers/residues to thereby leave said underlying dielectric layer or oxide layer in a reduced state, wherein the hydrogen-based plasma includes helium and about 3% hydrogen to about 30% hydrogen by volume.

2. The plasma ashing process according to claim 1, wherein said underlying dielectric layer or oxide layer is in a reduced state such that the adhesion properties of said underlying dielectric layer or oxide layer are not substantially degraded by said plasma ashing process.

3. The plasma ashing process according to claim 1, wherein the hydrogen-based plasma includes less than about 5% hydrogen by volume.

4. The plasma ashing process according to claim 1, wherein the hydrogen-source gas is selected from the group consisting of hydrocarbons, hydrofluorocarbons, and hydrogen gas.

5. The plasma ashing process according to claim 1, wherein the hydrogen source gas is hydrogen gas.

6. The plasma ashing process according to claim 1, wherein the substrate is exposed to said hydrogen-based plasma under plasma ashing conditions such that the reflectivity index of the underlying dielectric layer or oxide layer is substantially unchanged by said plasma ashing process.

7. The plasma ashing process according to claim 1, wherein the substrate is exposed to said hydrogen-based plasma under plasma ashing conditions such that the wetting angle of the underlying dielectric layer or oxide layer is substantially unchanged by said plasma ashing process.

8. The plasma ashing process according to claim 1, wherein the hydrogen-based plasma is substantially free from reactive nitrogen species and reactive oxygen species.

9. The plasma ashing process according to claim 1, wherein said plasma ashing is a rework ashing process.

10. A plasma ashing process for selectively removing photoresist, organic overlayers and/or polymers/residues from a semiconductor substrate, the process comprising:
    providing a substrate comprising a dielectric or oxide surface layer;
    pretreating said dielectric or oxide surface layer with a first hydrogen based plasma to generate substrate comprising a hydrogen-treated dielectric or oxide layer;
    depositing at least one photoresist layer, organic overlayers and/or polymers/residues over said hydrogen-treated dielectric or oxide layer;
    patterning said photoresist layer via an etching process to generate a substrate comprising an etched photoresist pattern over said hydrogen-treated dielectric or oxide layer;
    exposing said substrate comprising an etched photoresist pattern over said hydrogen-treated dielectric or oxide layer to a second hydrogen-based plasma under plasma ashing conditions sufficient to selectively remove the photoresist, organic overlayers and/or polymers/residues to thereby leave said underlying hydrogen-treated dielectric or oxide layers in a reduced state, wherein the second hydrogen-based plasma includes helium and about 3% hydrogen to about 30% hydrogen by volume.

11. The plasma ashing process according to claim 10, wherein said dielectric or oxide layer are in a reduced state such that the adhesion properties of said underlying hydrogen-treated dielectric or oxide layer are not substantially degraded by said plasma ashing process.

12. The plasma ashing process according to claim 10, wherein said hydrogen pretreatment, said etching process, and said plasma ashing are performed in a single plasma reactor.

13. The plasma ashing process according to claim 10, wherein said hydrogen pretreatment is performed in a first plasma reactor, and said etching process and said plasma ashing are performed in a second plasma reactor.

14. The plasma ashing process according to claim 10, wherein said plasma ashing is a rework ashing process.

15. The plasma ashing process according to claim 10, wherein the hydrogen-based plasma includes less than about 5% hydrogen by volume.

16. The plasma ashing process according to claim 10, wherein the second hydrogenplasma comprises a gas is selected from the group consisting of hydrocarbons, hydrofluorocarbons, and hydrogen gas.

17. The plasma ashing process according to claim 10, wherein the second hydrogen plasma is is hydrogen gas.

18. The plasma ashing process according to claim 10, wherein the reflectivity index of the underlying hydrogen-treated dielectric or oxide layer is substantially unchanged by said plasma ashing processing.

19. The plasma ashing process according to claim 10, wherein the wetting angle of the underlying hydrogen-treated dielectric or oxide layer is substantially unchanged by said plasma ashing processing.

20. The plasma ashing process according to claim 10, wherein the second hydrogen-based plasma is substantially free from reactive nitrogen species and reactive oxygen species.

* * * * *

UNITED STATES PATENT AND TRADEMARK OFFICE
CERTIFICATE OF CORRECTION

| | |
|---|---|
| PATENT NO. | : 7,642,195 B2 |
| APPLICATION NO. | : 11/235298 |
| DATED | : January 5, 2010 |
| INVENTOR(S) | : Wendy H. Yeh |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 436 days.

Signed and Sealed this

Sixteenth Day of November, 2010

David J. Kappos
*Director of the United States Patent and Trademark Office*